(12) United States Patent
Amiya et al.

(10) Patent No.: US 10,700,243 B2
(45) Date of Patent: Jun. 30, 2020

(54) LIGHT EMITTING DEVICE AND PLANT CULTIVATION METHOD

(71) Applicant: NICHIA CORPORATION, Anan-shi, Tokushima (JP)

(72) Inventors: Mika Amiya, Naruto (JP); Kazushige Fujio, Tokushima (JP); Sadakazu Wakui, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/352,473

(22) Filed: Mar. 13, 2019

(65) Prior Publication Data

US 2019/0288165 A1    Sep. 19, 2019

(30) Foreign Application Priority Data

Mar. 14, 2018   (JP) .................. 2018-047254

(51) Int. Cl.
*H01L 33/50* (2010.01)
*A01G 7/04* (2006.01)
*H01L 25/075* (2006.01)

(52) U.S. Cl.
CPC ............ *H01L 33/502* (2013.01); *A01G 7/045* (2013.01); *H01L 25/0753* (2013.01)

(58) Field of Classification Search
CPC ... H01L 33/502; H01L 25/0753; A01G 7/045; F21V 9/30
See application file for complete search history.

(56) References Cited

U.S. PATENT DOCUMENTS

| 9,400,088 B2 | 7/2016 | Hata et al. |
| 9,666,769 B2 | 5/2017 | Osaki et al. |
| 9,719,013 B2 | 8/2017 | Fiedler et al. |
| 9,719,014 B2 | 8/2017 | Fiedler et al. |
| 9,725,646 B2 | 8/2017 | Fiedler et al. |
| 2013/0264934 A1 | 10/2013 | Osaki et al. |
| 2014/0240976 A1 | 8/2014 | Hata et al. |
| 2014/0340890 A1* | 11/2014 | Hata ............ A01G 7/045 362/231 |
| 2015/0327446 A1 | 11/2015 | Kawaguchi et al. |
| 2016/0312118 A1 | 10/2016 | Fiedler et al. |
| 2016/0326430 A1 | 11/2016 | Fiedler et al. |
| 2017/0018689 A1 | 1/2017 | Yu |

(Continued)

FOREIGN PATENT DOCUMENTS

| EP | 3262924 A1 | 1/2018 |
| JP | 2008181771 A | 8/2008 |

(Continued)

*Primary Examiner* — David Vu
(74) *Attorney, Agent, or Firm* — Hunton Andrews Kurth LLP

(57) ABSTRACT

A light emitting device includes a light emitting element having an emission peak wavelength in a range of 380 nm or more and 490 nm or less, and a red fluorescent material which is excited by the light from the light emitting element to emit light having at least one light emission peak wavelength in a range of 580 nm or more and 680 nm or less, wherein a ratio of the photon flux R of red light in a range of 620 nm or more and 700 nm or less to the photon flux B of blue light in a range of 400 nm or more and 490 nm or less, R/B, is in a range of more than 20 and 200 or less.

10 Claims, 5 Drawing Sheets

(56) References Cited

U.S. PATENT DOCUMENTS

2017/0037308 A1 2/2017 Romer et al.
2017/0058195 A1 3/2017 Fiedler et al.
2017/0306224 A1 10/2017 Fiedler et al.
2018/0000016 A1 1/2018 Amiya et al.

FOREIGN PATENT DOCUMENTS

| JP | 2011155948 A | 8/2011 |
| JP | 2013062438 A | 4/2013 |
| JP | 2013065709 A | 4/2013 |
| JP | 2013099254 A | 5/2013 |
| JP | 2016535800 A | 11/2016 |
| JP | 2018006455 A | 1/2018 |
| WO | 2014/125714 A1 | 8/2014 |

\* cited by examiner

LIGHT EMITTING DEVICE AND PLANT CULTIVATION METHOD

CROSS-REFERENCE TO RELATED PATENT APPLICATION

This application claims priority to Japanese Patent Application No. 2018-047254, filed on Mar. 14, 2018, the entire disclosures of which is incorporated herein by reference in it entirety.

BACKGROUND

Technical Field

The present invention relates to a light emitting device and a plant cultivation method. In this specification, a "fluorescent material" is used in the same meaning as a "fluorescent phosphor".

Description of Related Art

Among environmental changes owing to climate change and man-made environmental disruption. It is desired to stably supply plants such as vegetables to increase the production efficiency of plants. For example, artificially controllable plant factories can stably supply clean and safe vegetables in the market, and are expected to be a next-generation industry. In plant factories, for power saving and for efficiently growing plants, a light emitting device using a light emitting diode (LED) is employed. LED enables control of combination and intensity of light wavelength, and enables photoirradiation in accordance with plant growth speed and morphogenesis, and is therefore expected as a high-value plant growth light source capable of promoting plant growth and having a wealth of functional nutrient components.

Reaction of plants to light is grouped into photosynthesis and photomorphogenesis, and photosynthesis is a reaction of decomposing water using a light energy to generate oxygen to thereby fix carbon dioxide on an organic material. The carbohydrate to be formed as a result of photosynthesis becomes a raw material for cellular architecture in plants to be an energy source for plant growth. Photomorphogenesis is a morphogenetic reaction using light as a signal to carry out seed germination, differentiation (shoot formation, leaf formation), movement (pore opening and closing, chloroplast movement), phototropism, etc. A plant has plural photoreceptors (pigments) of recognizing light, and in the case of photosynthesis reaction, chlorophyll a, chlorophyll b and carotenoid capture light as an energy. In the case of photomorphogenesis, phytochrome, cryptochrome and phototropin receive light as a signal.

The wavelength range of light that a plant can use for photosynthesis or photomorphogenesis using a photoreceptor is in a range of 300 nm or more and 800 nm or less. Radiation within the wavelength range is referred to as physiologically active radiation, and among it, radiation in a wavelength range of 400 nm or more and 700 nm or less that may be an energy source for plant growth is referred to as photosynthetically active radiation. The intensity of light necessary for plant photosynthesis may be referred to as photosynthetic photon flux density or photosynthetic photon flux (also referred to as PPF).

The intensity of light to be applied to plants and others is represented by a photon flux density or a photon flux (also represented by PF). The photon flux density ($\mu mol \cdot m^{-2} \cdot s^{-1}$) is a number of photons having reached a unit area per unit time. The photon flux ($\mu mol \cdot s^{-1}$) is the number of photons per unit time. Depending on plant growth, the ratio (R/B) of the photon flux R in a red region to the photon flux B in a blue region that a photoreceptor recognizes must be controlled. Accordingly, Japanese Unexamined Patent Publication No. 2013-099254 has been proposed a light emitting device including a combination of a blue-emitting LED chip and a fluorescent material of absorbing the blue light emitted by the LED chip to emit a light of red than blue. In addition, Japanese Unexamined Patent Publication No. 2008-181771 has also been proposed a method of supplementing red light by combination of a fluorescent material to emit a light of red and an already existing light source of emitting a white light.

However, the light emitting device disclosed in PTL 1 is problematic in that, when used for light supplement as combined with an already existing light source of emitting a white light, the spectral balance of light that the already existing light source emits is lost and therefore, in the spectrum of light emitted by the already existing light source, the green light in a range of more than 490 nm and 570 nm or less and an yellow to orange light in a range of more than 570 nm and less than 620 nm tend to decrease, though the details thereof will be described below.

Accordingly, embodiments of the present disclosure are to provide a light emitting device and a plant cultivation method, which, when used along with an already existing light source, enable red light supplement without losing the spectral balance of light emitted by the already existing light source used therein.

SUMMARY

A subject matter for solving the above-mentioned problems is as described below, and the present disclosure includes the following embodiments.

A first embodiment of the present disclosure is directed to a light emitting device including:

a light emitting element having an emission peak wavelength in a range of 380 nm or more and 490 nm or less; and a red fluorescent material which is excited by the light from the light emitting element to emit light having at least one light emission peak wavelength in a range of 580 nm or more and 680 nm or less, wherein a ratio of the photon flux R of red light in a range of 620 nm or more and 700 nm or less to the photon flux B of blue light in a range of 400 nm or more and 490 nm or less, R/B, is more than 20 and 200 or less (hereinafter the ratio of the photon flux R of red light in a range of 620 nm or more and 700 nm or less to the photon flux B of blue light in a range of 400 nm or more and 490 nm or less may be referred to as "ratio R/B").

A second embodiment of the present disclosure is directed to an illumination device including a combination of the light emitting device and a light source that emits a light energy different from that of the light emitting device.

A third embodiment of the present disclosure is directed to a plant cultivation method including irradiating plants with the light emitted by the light emitting device.

According to the present disclosure, provided is a light emitting device which, when used along with an already existing light source, enable red light supplement without losing the spectral balance of light that the already existing light source emits. A plant cultivation method capable of promoting plant growth is also provided.

DETAILED DESCRIPTION

The light emitting device and the plant cultivation method of the present disclosure will be described below with reference to embodiments thereof. The embodiments described below are exemplifications to embody the technical idea of the present invention, and the present invention is not limited to the light emitting device and the plant cultivation method described below. The relationship between the color names and the chromaticity coordinates, and the relationship between the wavelength range of light and the color names of monochromic light are in accordance with JIS Z8110. Regarding the content of each component in a composition, in the case where the composition contains plural substances corresponding to one component therein, the content of the component means the total amount of the plural substances existing in the composition, unless otherwise specifically indicated.

Light Emitting Device

An embodiment of the present disclosure is directed to a light emitting device including: a light emitting element having an emission peak wavelength in a range of 380 nm or more and 490 nm or less (hereinafter this may be referred to as "near-ultraviolet to blue region"); and a red fluorescent material which is excited by the light from the light emitting element to emit light having at least one light emission peak wavelength in a range of 580 nm or more and 680 nm or less, wherein a ratio of the photon flux R of red light in a range of 620 nm or more and 700 nm or less to the photon flux B of blue light in a range of 400 nm or more and 490 nm or less, R/B, is more than 20 and 200 or less. In this description, the photon flux B of blue light falling within a range of 400 nm or more and 490 nm or less may be referred to as "photon flux B of blue light". Also in this description, the photon flux R of red light falling within a range of 620 nm or more and 700 nm or less may be referred to as "photon flux R of red light".

Figure 1:
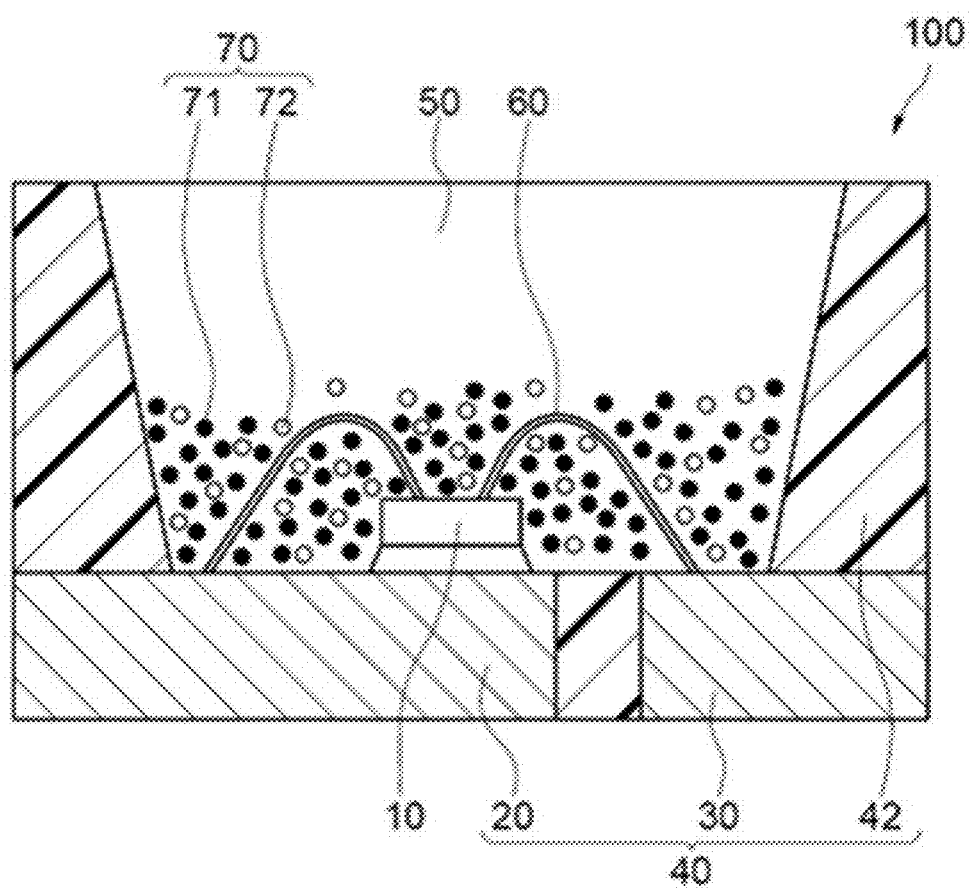
FIG. 1 is a schematic cross-sectional view showing an example of a light emitting device of the present disclosure.

One example of the light emitting device according to an embodiment of the present disclosure is described with reference to the drawings. FIG. 1 is a schematic cross-sectional view showing one example of the light emitting device according to an embodiment of the present invention, which corresponds to a light emitting device 100.

As shown in FIG. 1, the light emitting device 100 includes a light emitting element 10 having an emission peak wavelength in a range of 380 nm or more and 490 nm or less, and a red fluorescent material 70 which is excited by the light from the light emitting element to emit light having at least one light emission peak wavelength in a range of 580 nm or more and 680 nm or less.

The light emitting device 100 includes, for example, a molded body 40, the light emitting element 10, and a fluorescent member 50. The molded body 40 is composed of a first lead 20 and a second lead 30 as integrally molded with a resin part 42 containing a thermoplastic resin or a thermosetting resin. The molded body 40 forms a recess part having a bottom and a side, and the light emitting element 10 is mounted on the bottom of the recess part. The light emitting element 10 has a pair of positive and negative electrodes, and the pair of positive and negative electrodes are electrically connected to the first lead 20 and the second lead 30, respectively, each via a wire 60. The light emitting element 10 is covered with the fluorescent member 50. For example, the fluorescent member 50 contains a fluorescent material 70 that undergoes wavelength conversion of the light from the light emitting element 10, and a sealant material. The fluorescent material 70 is a red fluorescent material 70 that emits red light by the light emitted by the light emitting element 10 having an emission peak wavelength in a range of 380 nm or more and 490 nm or less. The first lead 20 and the second lead 30 each connected to the pair of positive and negative electrodes of the light emitting element 10 are partly exposed out of the package that constitutes the light emitting device 100. Via the first lead 20 and the second lead 30, the light emitting device 100 receives an external power to emit light.

The fluorescent member 50 functions not only for wavelength conversion of light emitted by the light emitting element 10 but also as a member for protecting the light emitting element 10 from external environments. In FIG. 1, the red fluorescent material 70 exists inside the fluorescent member 50 and is arranged in the vicinity of the light emitting element 10. Accordingly, the light from the light emitting element 10 can be efficiently subjected to wavelength conversion by the red fluorescent material 70, and therefore a light emitting device having excellent light emission efficiency can be thereby provided. The arrangement of the fluorescent member 50 containing the red fluorescent material 70 and the light emitting element 10 is not limited to the embodiment of FIG. 1 where the red fluorescent material 70 is arranged in the vicinity of the light emitting element 10, but in consideration of the heat to be generated by the light emitting element 10, the red fluorescent material 70 may be so arranged as to be spaced from the light emitting element 10 in the fluorescent member 50. In addition, the red fluorescent material 70 may be nearly uniformly arranged in the fluorescent member 50 so that the light emitting device 100 can emit light free from color unevenness.

A plant grows in such a manner that pigments (chlorophyll a, chlorophyll b and carotenoid) existing in the chloroplast therein absorb light and take carbon dioxide gas and water thereinto for photosynthesis to convert them into carbohydrates (saccharides). Chlorophyll a and chlorophyll b used for promoting plant cultivation have absorption peaks especially in a red light region of 625 nm or more and 675 nm or less and in a blue light region of 425 nm or more and 475 nm or less. Among plant photoreceptors, chlorophyll a captures light energy in a blue region of 400 nm or more and 450 nm or less and light energy in a red region of 660 nm or more and 700 nm or less for photosynthesis. Chlorophyll b captures light energy in a blue region of 430 nm or more and 500 nm or less and light energy in a red region of 640 nm or more and 670 nm or less for photosynthesis. Carotenoid captures light energy in a blue to green region of 400 nm or more and 530 nm or less for photosynthesis. Among photoreceptors to carry out photomorphogenesis, for example, phytochrome A induces seed germination, taking light in a blue region of 360 nm or more and 480 nm or less as a signal. Phytochrome B induces seed germination, taking light in a red region of 540 nm or more and 690 nm or less as a signal.

In the growth stage thereof, a plant undergoes not only photosynthesis but also photomorphogenesis such as induction of germination from seeds, hypocotyl growth, flower initiation and light refraction. Depending on the type and the growth stage of plants, light supplement of not only white light such as typically sunlight but also red light is effective for plants for the purpose of promoting plant growth and enhancing functional plant nutrient components. Further, it has become known that green light of more than 490 nm and 570 nm or less, which has heretofore been said to have few influences on plant growth, could contribute toward plant growth promotion and toward enhancement of functional plant nutrient components, depending on the type of plants, and could have influence on stomatal opening and closing and on hypocotyl growth of etiolated seedlings. In addition, light that includes green light components in a range of more than 490 nm and 570 nm or less, and yellow to orange light emitting components in a range of more than 570 nm and less than 620 nm is necessary for human working environments. In the case of red light supplement, when red light could be supplemented efficiently using a small number of light emitting devices and without losing so much the spectral balance of the blue region spectrum and the yellow to orange region spectrum among the light emission spectrum that an already existing, for example, white light emitting light source has, then plant growth could be promoted efficiently while reducing power consumption and capital investment cost, and plants having a wealth of functional nutrient components could therefore be cultivated.

In the light emitting device according to an embodiment of the present disclosure, the ratio of the photon flux R of red light in a range of 620 nm or more and 700 nm or less to the photon flux B of blue light in a range of 400 nm or more and 490 nm or less, R/B, is more than 20 and 200 or less. In the light emitting device according to an embodiment of the present invention, where the ratio R/B is in a range of more than 20 and 200 or less, the ratio R/B can be appropriately selected in accordance with the type of plants or on the growth stage of plants. In the light emitting device according to an embodiment of the present disclosure, the ratio of the photon flux R of red light to the photon flux B of blue light, R/B, is preferably in a range of 30 or more and 180 or less, more preferably in a range of 35 or more and 150 or less, even more preferably in a range of 40 or more and 140 or less, in a range of 50 or more and 120 or less, and in a range of 80 or more and 120 or less. In the case where the ratio R/B is in a range of more than 20 and 200 or less in the light emitting device according to an embodiment of the present disclosure, it is possible to attain efficient red light supplement using a small number of red light supplementing light emitting devices and using an already existing white light emitting light source, depending on the type of plants or on the growth stage of plants and without losing the spectral balance of the already existing, for example, white light emitting light source.

In a light emitting device including a light emitting element having an emission peak wavelength in a near-UV to blue region and a red fluorescent material, when the ratio of the photon flux R of red light to the photon flux B of blue light, R/B, is 20 or less, then the excited light emitted from the light emitting element may not undergo wavelength conversion in the red fluorescent material and the components of blue light to emitted from the light emitting device may increase and, as a result, efficient supplement of desired red light would become difficult as the case may be. In addition, in such a light emitting device, when the ratio R/B is 20 or less, blue light of an excited light from the light emitting element may leak out and components of blue light may additionally supplement along with those of red light. And if so, in the case where an already existing, for example, white light emitting light source and a red light supplementing light emitting device are combined, the components of blue light emitted from the red light supplementing light emitting device may be added to the spectrum of the light that the already existing light source has emitted and, as a result, the components of green light to yellow light may relatively decrease and the spectral balance of the light emitted by the already existing light source may be thereby lost and, in the case, pure red light alone could not be supplemented. On the other hand, in the light emitting device, when the ratio of the photon flux R of red light to the photon flux B of blue light, R/B, is more than 200, the amount of the red fluorescent material contained on the light emitting device is too much and the red light may decay owing to self-absorption of the fluorescent material.

Preferably, the spectrum of the light emitted by the light emitting device according to an embodiment of the present disclosure has at least one light emission peak in a range of 580 nm or more and 680 nm or less, and the full width at half maximum of the emission peak is 40 nm or more. More preferably, the full width at half maximum of the emission peak existing in a range of 580 nm or more and 680 nm or less in the spectrum of the light emitted by the light emitting device is in a range of 40 nm or more and 120 nm or less, even more preferably in a range of 50 nm or more and 120 nm or less, and further more preferably in a range of 60 nm or more and 110 nm or less. In the spectrum of the light emitted by the light emitting device, the emission peak existing in a red region of 580 nm or more and 680 nm or less preferably has a relatively broad shape in such a manner that the full width at half maximum of the emission peak is, for example, 40 nm or more. When the full width at half maximum of the emission peak existing in a red region of 580 nm or more and 680 nm or less is broad, photoreceptors of more kinds of plants can absorb supplemented red light as a light energy, or can detect the light as a light signal in the spectrum of the light emitted by the emitting device. The light emitting device according to an embodiment of the present disclosure can supply red light having a relative broad light emission peak in the spectrum of the light emitted by the light emitting device, and a large number of photoreceptors can readily absorb or detect the red light emitted by the light emitting device and, accordingly, plant growth can be promoted in a stable state and functional plant nutrient components can be enhanced in a stable state. The full width at half maximum of the light emitting device means the full width at half maximum (FWHM) of the emission peak in the spectrum of the light emitted by the light emitting device. The full width at half maximum of the light emitting device means the wavelength width of an emission peak that indicates a value of 50% of the maximum value of the emission peak existing in a range of 580 nm or more and 680 nm or less, in the spectrum of the light emitted by the light emitting device.

For example, in the case of a light emitting device including a red light emitting LED chip, the full width at half maximum of the emission peak existing in a range of 580 nm or more and 680 nm or less is generally less than 30 nm, and is generally in a range of 15 nm or more and 25 or less. In the spectrum of the light emitted by the light emitting device equipped with a red light emitting LED chip, when the full width at half maximum of the emission peak existing in a red region of 580 nm or more and 680 nm or less is less than 30 nm, or has a sharp shape, the kind of the photoreceptor of the plant that absorbs or detects the red light supplemented by the light emitting device may be limited and the plant growth may be thereby unstable, as the case may be.

The intensity of light acting on photosynthesis or photomorphogenesis of plants depends on the number of photons. The energy level of a photon varies in reverse proportion to the wavelength thereof. When Planck constant ($6.63 \times 10^{-34}$ Js) is represented by h, the light speed is represented by c ($3 \times 10^8$ m·s$^{-1}$), and wavelength is represented by $\lambda$ (m), the photon energy e is expressed by an expression of e=hc/$\lambda$. The light dependency to activate photosynthesis reaction varies depending on the type of photoreceptors such as photosynthetic pigments.

The photon flux ($\mu$mol·s$^{-1}$) can be converted from a radiation flux (W). The relation between the radiation flux and the photon flux is represented by the following expression (1).

Radiation Flux($W$)=photon flux($\mu$mol·s$^{-1}$)×Avogadro number(mol$^{-1}$)×Planck constant $h$(Js)×light speed(m·s$^{-1}$)÷wavelength($m$)  (1)

From the radiation flux (W) obtained from the light emitting device and on the basis of the above-mentioned expression (1), the photon flux can be converted. After the conversion, the photon flux in a range of 400 nm to 490 nm is integrated to calculate the photon flux B of blue light. Similarly, the photon flux in a range of 620 nm or more and 700 nm or less is integrated to calculate the photon flux R of red light.

Light Emitting Element

The light emitting element 10 is used as an excitation light source and emits light having an emission peak wavelength in a range of 380 nm or more and 490 nm or less. With this, a light emitting device having high efficiency and high output linearity relative to input, having high mechanical impact resistance and stable can be obtained. More preferably, the range of the emission peak wavelength of the light emitting element is in a range of 390 nm or more and 480 nm or less, even more preferably in a range of 420 nm or more and 470 nm or less, still more preferably in a range of 440 nm or more and 460 nm or less, and especially preferably in a range of 445 nm or more and 455 nm or less. As the light emitting element of the type, preferred is use of a light emitting element containing a nitride semiconductor (In$_X$Al$_Y$Ga$_{1-X-Y}$N, 0≤X, 0≤Y, X+Y≤1). The full width at half maximum of the emission spectrum of the light emitting element may be, for example, 30 nm or less.

Fluorescent Member

The fluorescent member 50 for use in the light emitting device 100 preferably contains the red fluorescent material 70 and a sealant material. The sealant material may be a resin selected from a thermoplastic resin and a thermosetting resin. In consideration of easy producibility, examples of the resin for use for the sealant material include a silicone resin and an epoxy resin. The fluorescent material may contain, in addition to the red fluorescent material and the sealant material, any other component such as a filler, a light stabilizer and a colorant. Examples of the filler include silica, barium titanate, titanium oxide, and aluminum oxide. The content of the other component than the red fluorescent material and the sealant material in the fluorescent member is preferably in a range of 0.01 parts by mass or more and 20 parts by mass or less relative to 100 parts by mass of the sealant material therein. Also in the fluorescent member composition to constitute the fluorescent member, the content of a substance to be the other component than the red fluorescent material and the sealant material is preferably in a range of 0.01 parts by mass or more and 20 parts by mass or less relative to 100 parts by mass of a resin to be the sealant material therein.

The content of the red fluorescent material 70 in the fluorescent member is not specifically limited so far as the content could be an amount satisfying the requirement that the ratio of the photon flux R of red light falling in a range of 620 nm or more and 700 nm or less to the photon flux B of blue light falling in a range of 400 nm or more and 490 nm or less, R/B, is in a range of more than 20 and 200 or less. The content of the red fluorescent material in the fluorescent member 50 may be, for example, in a range of 5 parts by mass or more and 150 parts by mass or less relative to 100 parts by mass of the sealant material therein, preferably in a range of 8 parts by mass or more and 130 parts by mass or less, more preferably in a range of 10 parts by mass or more and 120 parts by mass or less, even more preferably in a range of 12 parts by mass or more and 100 parts by mass or less. When the content of the red fluorescent material 70 in the fluorescent member 50 falls within the above-mentioned range, the light emitted by the light emitting element 10 can be efficiently subjected to wavelength conversion by the red fluorescent material, and the red light can be well supplemented with no loss of blue light, the excited light from the light emitting element. In addition, when the content of the red fluorescent material 70 in the fluorescent member 50 falls within the above-mentioned range, the red light can also be supplemented with no decay of the red light owing to the self-absorption of the red fluorescent material. Further, when the content of the red fluorescent material 70 in the fluorescent member 50 falls within the above-mentioned range, and when the red light supplementing light emitting device is combined with an already existing white light emitting light source, red light can be efficiently supplemented without losing the spectral balance of the light emitted by the already existing white light emitting light source.

Red Fluorescent Material

The red fluorescent material 70 is a fluorescent material which is excited by the light from the light emitting element 10 to emit light having one or more light emission peaks in a wavelength range of 580 nm or more and 680 nm or less. Examples of the red fluorescent material include an $Eu^{2+}$-activated nitride fluorescent material, an $Mn^{4+}$-activated fluorogermanate fluorescent material, an $Eu^{2+}$-activated alkaline earth sulfide fluorescent material, and an $Mn^{4+}$-activated halide fluorescent material. The red fluorescent material for use herein may be one alone or two or more selected from these fluorescent materials.

Preferably, the red fluorescent material includes an $Eu^{2+}$-activated silicon nitride (hereinafter this may be referred to as "CASN fluorescent material") comprising Al and at least one element selected from Sr and Ca. Preferably, the red fluorescent material contains at least one fluorescent material selected from the group consisting of an $Eu^{2+}$-activated aluminum nitride comprising at least one element selected from the group consisting of an alkaline earth metal element and at least one element selected from the group consisting of an alkali metal element, an $Mn^{4+}$-activated fluorogermanate fluorescent material, an $Eu^{2+}$-activated, Ca or Sr sulfide-containing fluorescent material, and an $Mn^{4+}$-activated fluoride comprising at least one element selected from the group consisting of an alkali metal element and an ammonium ion ($NH_4+$) and at least one element selected from the group consisting of a Group-4 element and a Group-14 element.

Specifically, the red fluorescent material 70 includes a fluorescent material having a composition of any of the following formulae (I) to (VI). Above all, the red fluorescent material preferably contains a fluorescent material containing a silicon nitride having a composition of the following formula (I). The fluorescent material containing a composition of any of the following formulae (I) to (VI) emits red light by the excited light from the light emitting element, and in a light emission spectrum of the light emitting device, the full width at half maximum of the emission peak existing in a range of 580 nm or more and 680 nm or less of the fluorescent material is 40 nm or more, that is, the emission peak of the fluorescent material has a relatively broad shape. The full width at half maximum of the emission peak existing in a range of 580 nm or ore and 680 nm or less of the red fluorescent material 70 is 40 nm or more, that is, the emission peak has a relatively broad shape, and therefore, using the light emitting device of the type, photoreceptors of more kinds of plants can absorb the supplemented red light as a light energy or can detect the supplemented red light as a light signal, and accordingly, the light emitting device can supply red light capable of stably promoting plant growth and capable of stably enhancing functional plant nutrient components.

  (I)

wherein s, t, u, v, w and x each represent a number satisfying $0 \leq s \leq 1$, $0 < t < 1.0$, $0 < s+t < 1.0$, $0.8 \leq x \leq 1.0$, $0.8 \leq u \leq 1.2$, $0.8 \leq v \leq 1.2$, $1.9 \leq u+v \leq 2.1$, and $2.5 \leq w \leq 3.5$. The fluorescent material containing the composition represented by the formula (I) may be expressed as a $CaAlSiN_3$:Eu fluorescent material or an $(Sr,Ca)AlSiN_3$:Eu fluorescent material. In the formula (I), the parameter value t indicates a molar ratio of the activating element Eu in the composition represented by the formula (I). In this description, the term "molar ratio" refers to the molar amount of an element in one mole of the chemical composition of a fluorescent material. The parameter value t is preferably $0.0001 \leq t \leq 0.2$, more preferably $0.0001 \leq t \leq 0.1$, even more preferably $0.0002 \leq t \leq 0.05$. In the formula (I), the parameter value s indicates a molar ratio of Sr in the composition represented by the formula (I), The parameter value s is preferably $0 \leq s \leq 0.98$, more preferably $0 \leq s \leq 0.95$, even more preferably $0 \leq s \leq 0.9$.

  (II)

wherein p, q and r each satisfy $0 \leq p \leq 1.0$, $0 \leq q \leq 1.0$, $0 < r < 1.0$, and $p+q+r \leq 1.0$.

  (III)

wherein a, b, c, d, e and f each satisfy $0 \leq a < 1.0$, $0.8 \leq b \leq 1.05$, $0.001 < c \leq 0.1$, $0 \leq d \leq 0.2$, $3.0 \leq e \leq 5.0$, and $0.8 \leq f \leq 1.05$.

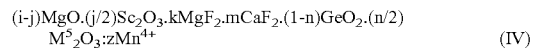  (IV)

wherein $M^5$ represents at least one selected form the group consisting of Al, Ga and In, and i, j, k, m, n and z each satisfy $2 \leq i \leq 4$, $0 \leq j < 0.5$, $0 < k < 1.5$, $0 \leq m < 1.5$, $0 < n < 0.5$, and $0 < z < 0.05$.

  (V)

In this description, the plural elements sectioned by comma (,) in the formula expressing the composition of a fluorescent material mean that at least one of these plural elements is contained in the composition. The plural elements sectioned by comma (,) in the compositional formula means that the composition contains at least one element selected from the plural elements sectioned by the comma and may include two or more, as combined, selected from the plural elements. Also in this description, the part before the column (:) in the formula representing the composition of the fluorescent material expresses a host crystal, and the part after the column (:) expresses an activating element.

  (VI)

wherein A represents at least one selected from the group consisting of K, Li, Na, Rb, Cs and $NH_4+$, $M^1$ represents at least one element selected from the group consisting of a Group-4 element and a Group-14 element, and g satisfies $0 < g < 0.2$.

Other Fluorescent Material than Red Fluorescent Material

The light emitting device 100 may contain any other kind of fluorescent material that emits light in any other wavelength region than the wavelength region of red light, in addition to the red fluorescent material 70, so far as the ratio of the photon flux R of red light in a range of 620 nm or more and 700 nm or less to the photon flux B of blue light in a range of 400 nm or more and 490 nm or less, R/B, thereof falls in a range of more than 20 and 200 or less. The other kind of fluorescent material includes, for example, a green fluorescent material that absorbs a part of the light emitted by the light emitting element 10 to emit green light, a yellow fluorescent material to emit yellow light, and a far-IR fluorescent material having an emission peak wavelength in a range of more than 680 nm.

Specifically, the green fluorescent material includes a fluorescent material having a composition of any of the following formulae (i) to (iii).

  (i)

wherein $M^{11}$ represents at least one selected from the group consisting of Ca, Sr, Ba and Zn, and $X^{11}$ represents at least one selected from the group consisting of F, Cl, Br and I.

  (ii)

wherein b satisfies $0 < b < 4.2$.

  (iii)

wherein $M^{13}$ represents at least one selected from the group consisting of Mg, Ca, Sr and Ba.

Further, examples of the green fluorescent material include a silicate fluorescent material such as $(Ca,Sr,Ba)_2SiO_4$:Eu, and $Ca_3Sc_2Si_3O_{12}$:Ce.

Specifically, the yellow fluorescent material includes a fluorescent material containing a composition of any of the following formulae (iv) to (v).

$$M^{14}{}_{c/e}Si_{12-(c+d)}Al_{c+d}O_dN_{16-d}\text{:Eu} \qquad \text{(iv)}$$

wherein $M^{14}$ represents at least one selected from the group consisting of Sr, Ca, Li and Y, c represents 0.5 to 5, d represents 0 to 2.5, and e represents a charge of $M^{14}$.

$$M^{15}{}_3(Al,Ga)_5O_{12}\text{:Ce} \qquad \text{(v)}$$

wherein $M^{15}$ represents Y or at least one selected from the group consisting of Lu, Gd and Tb.

Specifically, the far-IR fluorescent material having an emission peak wavelength in a range of more than 680 nm includes a fluorescent material having a composition of any of the following formulae (vi) to (xi).

$$(Al_{1-f}Cr_f)_2O_3 \qquad \text{(vi)}$$

wherein f is satisfies $0<f<1$.

$$(Ln_{1-x-y}Ce_xCr_y)_3(Al_{1-z}M^{16}{}_z)_5O_{12} \qquad \text{(vii)}$$

wherein Ln represents at least one rare earth element selected from the group consisting of rare earth elements except Ce, $M^{16}$ represents at least one element selected from the group consisting of Ga and In, and x, y and z each satisfy $0.0002<x<0.50$, $0.0001<y<0.05$, $0 \leq z \leq 0.8$.

$$CaYAlO_4\text{:Mn} \qquad \text{(viii)}$$

$$LiAlO_2\text{:Fe} \qquad \text{(ix)}$$

$$CdS\text{:Ag} \qquad \text{(x)}$$

$$GdAlO_3\text{:Cr} \qquad \text{(xi)}$$

White Light Emitting Light Source

The light emitting device according to a first embodiment of the present disclosure may be used in combination with an already existing light source. Preferably, the light emitting device according to the first embodiment of the present disclosure is used in combination with a white light emitting light source. Even when used in combination with an already existing, for example, white light emitting light source, a small number of the light emitting devices relative to the already existing light source can efficiently supplement a necessary red light depending on the type of plants and on the growth stage of plants, without losing the spectral balance of the light emitted by the already existing light source. Examples of the white light include sunlight, and lights to be emitted by various types of lamps. As the light source that emits white light, for example, at least one light source selected from the group consisting of sun, a fluorescent lamp, an incandescent lamp, a metal halide lamp, a high-pressure sodium lamp and an LED lamp may be used here.

When combined with a white light emitting light source, the light emitting device according to the first embodiment of the present disclosure can be used as a light emitting device for red light supplement capable of promoting plant growth and capable of enhancing functional plant nutrient components.

The light emitting device according to the first embodiment of the present disclosure can supplement red light necessary for plants, which activates photosynthesis of plants to promote plant growth and to enhance functional plant nutrient components. The light emitting device according to the first embodiment of the present disclosure can be used as a light emitting device for plant cultivation.

Illumination Device

The light emitting device according to the first embodiment of the present disclosure may be combined with a light source for emitting light energy different from that from the light emitting device to form an illumination device. The light source for emitting light energy different from that from the light emitting device is not limited to a white light emitting light source and, examples thereof include a light source that emits blue light. The illumination device constructed by combining the light emitting device according to the first embodiment of the present disclosure and the light source for emitting light energy different from that from the light emitting device can irradiate plants with optimum light energy and transmit an optimum light signal to plants depending on the type of plants or the growth stage of plants.

Plant Cultivation Method

The plant cultivation method according to another embodiment of the present disclosure is a method of cultivating plants by applying the light emitted from the light emitting device 100 to plants. According to the plant cultivation method, for example, the light from the light emitting device 100 can be applied to plants in a plant factory that enables artificially controlled photoirradiation. The type of plants to be cultivated according to the method is not specifically limited. According to the plant cultivation method, plant photosynthesis can be activated, and plant cultivation can be promoted so that the stems, leaves, roots, fruits, the cultivated plants can have good morphology and weight, and the functional plant nutrient components can be enhanced.

EXAMPLES

Hereinunder the present invention is described more specifically with reference to Examples. The present invention is not limited to these Examples.

Examples 1 to 2 and Comparative Examples 1 to 5

Red Fluorescent Material

As a red fluorescent material, used here was a fluorescent material of $CaAlSiN_3$:Eu having an emission peak wavelength at 660 nm as excited by the light from a light emitting element having an emission peak wavelength at 450 nm.

Light Emitting Device

In the light emitting device 100, a nitride semiconductor having an emission peak wavelength at 450 nm was used as the light emitting element 10. As the sealant material to constitute the fluorescent member 50, a silicone resin was used. To 100 parts by mass of the silicone resin, added was the red fluorescent material 70 at a blending ratio (part by mass) shown in Table 1, then mixed and dispersed, and defoamed to give a fluorescent member composition to constitute a fluorescent member. In the fluorescent member compositions for use for the light emitting devices of Examples 1 to 2 and Comparative Examples 1 to 5, the blending ratio of the red fluorescent material was so controlled that the photon flux B of blue light in a range of 400 nm or more and 490 nm or less, the photon flux R of red light in a range of 620 nm or more and 700 nm or less, and the ratio of the photon flux R of red light to the photon flux B of blue light, R/B, each could be as shown in Table 1. The fluorescent member composition was cast onto the light emitting element 10 in the recess part of the molded body 40, then filled into the recess part, heated at 150° C. for 3 hours to cure the fluorescent member composition, thereby forming the fluorescent member 50. In each of Examples 1 to 2 and Comparative Examples 1 to 5, the light emitting device 100 as shown in FIG. 1 was produced. Hereinunder the light emitting device 100 of Examples 1 to 2 and Comparative Examples 1 to 5 may be referred to as a red light supplementing light emitting device.

Photon Flux

Figure 2:
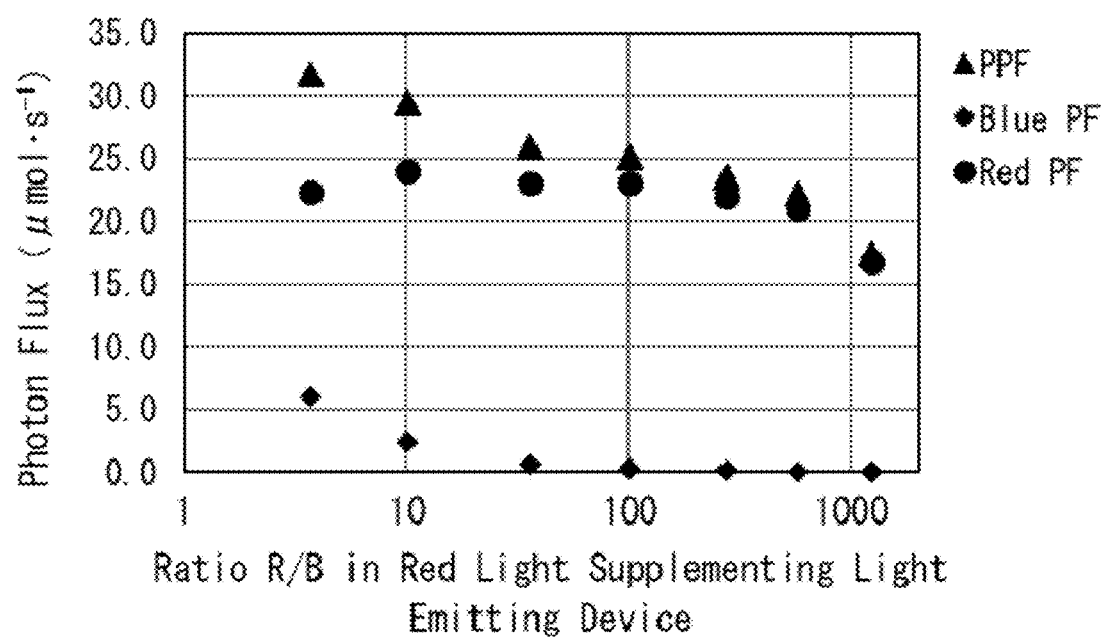
FIG. 2 is a graph showing a relationship between the blue light photon flux B (Blue PF), the red light photon flux R (Red PF) and the photosynthetic photon flux PPF, and the ratio R/B of the light emitting device for red light supplement in each of Examples and Comparative Examples.

The light emitted from the light emitting device of Examples 1 to 2 and Comparative Examples 1 to 5 was measured using a spectrometer (PMA-12 available from Hamamatsu Photonics). The resultant radiation flux (W) was converted into a photon flux based on the following equation (1) to draw a photon flux spectrum relative to wavelength, and the photon flux B of blue light was calculated through integration of the photon flux data in a range of 400 nm or more and 490 nm or less, the photon flux R of red light was calculated through integration of the photon flux data in a range of 620 nm or more and 700 nm or less, and the photosynthesis photon flux PPF was calculated through integration of the photon flux data in a range of 400 nm or more and 700 nm or less. The results are shown in Table 1. FIG. 2 shows the photon flux B of blue light in a range of 400 nm or more and 490 nm or less of the light emitted by the light emitting device of each Example and each Comparative Example, the photon flux R of red light in a range of 620 nm or more and 700 nm or less thereof, and the photosynthesis photon flux PPF in a range of 400 nm or more and 700 nm or less thereof. In FIG. 2, the horizontal axis indicates the ratio R/B of the red light supplementing light emitting device of each Example and each Comparative Example. In FIG. 2, the light emitting device of Comparative Example 1, the light emitting device of Comparative Example 2, the light emitting device of Example 1, the light emitting device of Example 2, the light emitting device of Comparative Example 3, the light emitting device of Comparative Example 4 and the light emitting device of Comparative Example 5 are in that order from the left side, and the photon flux B of blue light (Blue PF), the photon flux R of red light (Red PF) and the photosynthetic photon flux PPF are in that order from the bottom side.

Radiation Flux($W$)=photon flux($\mu mol \cdot s^{-1}$)×Avogadro number($mol^{-1}$)×Planck constant($Js$)×light speed ($m \cdot s^{-1}$)÷wavelength($m$)  (1)

Full Width at Half Maximum

From the photon flux spectrum relative to the wavelength of the light emitted by the light emitting device of each Example and each Comparative Example, the full width at half maximum (FWHM) of the emission peak existing in a range of 580 nm or more and 680 nm or less was derived. The full width at half maximum of the light emitting device of each Example and each Comparative Example means the wavelength width of an emission peak that indicates a value of 50% of the maximum value of the emission peak existing in a range of 580 nm or more and 680 nm or less, in the spectrum of the light emitted by the light emitting device. The results are shown in Table 1.

TABLE 1

| | Fluorescent Member Red Fluorescent Material CASN (part by mass) | Photon Flux | | | | |
|---|---|---|---|---|---|---|
| | | Photon Flux B of Blue Light (Blue PF) ($\mu mol \cdot s^{-1}$) | Photon Flux R of Red Light (Red PF) ($\mu mol \cdot s^{-1}$) | Ratio R/B | Photosynthesis Photon Flux PPF ($\mu mol \cdot s^{-1}$) | Full Width at Half Maximum (nm) |
| Comparative Example 1 | 5 | 6.0 | 22.3 | 4 | 31.7 | 90.5 |
| Comparative Example 2 | 10 | 2.4 | 24.1 | 10 | 29.4 | 88.0 |
| Example 1 | 15 | 0.6 | 23.0 | 36 | 25.9 | 86.0 |
| Example 2 | 20 | 0.2 | 23.0 | 101 | 25.1 | 83.5 |
| Comparative Example 3 | 25 | 0.1 | 21.9 | 273 | 23.5 | 83.0 |
| Comparative Example 4 | 30 | 0.0 | 21.0 | 571 | 22.2 | 81.0 |
| Comparative Example 5 | 50 | 0.0 | 16.8 | 1247 | 17.4 | 78.0 |

As shown in Table 1 and FIG. 2, when the ratio R/B of the light emitted from the red light supplementing light emitting device is large, the photosynthetic photon flux PPF tends to be small. As in the red light supplementing light emitting device of Examples 1 and 2, when the ratio R/B is in a range of more than 20 and 200 or less, the photon flux R of red light can be increased while suppressing reduction in the photosynthetic photon flux PPF, and depending on the type of plants or the growth stage of plants, the light emitting device can efficiently supplement red light. In addition, as in the red light supplementing light emitting device of Examples 1 and 2, when the ratio R/B is more than 20 and 200 or less, the photon flux B of blue light is small, and the excited light from the light emitting element in the device is not subjected to wavelength conversion by the red fluorescent material therein to prevent the blue light emitted by the light emitting device from falling out of the device, and, for example, when combined with an already existing white light emitting light source, the light emitting device does not lose the spectral balance of the light emitted from the already existing light source, that is, the light emitting device can efficiently supplement red light.

As shown in Table 1 and FIG. 2, in the light emitting device of Comparative Examples 1 and 2, the value of the photosynthesis photon flux PPF is larger than that in the light emitting device of Examples 1 and 2, and the value of the photon flux B of blue light is also larger than that in the light emitting device of Examples 1 and 2, and therefore in the former, the excited light of the light emitting element was not subjected to wavelength conversion and was emitted out of the light emitting device to cause falling of blue light out of the device. In the case where the light emitting device of Comparative Examples 1 and 2 is used in combination with, for example, a white light emitting light source, blue light components are added to the spectrum of the light emitted by the light source so that the components of green light to yellow light relatively decrease and, as a result, the balance of the spectrum of the white light emitted by the light source would be lost, and the device could not efficiently supplement red light alone. In the light emitting device of Comparative Examples 3 to 5, the value of the photosynthesis photon flux PPF is smaller than that in the light emitting device of Examples 1 and 2 and, in addition, the photon flux R of red light also becomes small, and as a result, the amount of the red fluorescent material contained in the light emitting device becomes too much, and owing to self-absorption, red light decays, that is, the light emitting device could not efficiently supplement red light.

Combination of White LED Light Emitting Device 1 and Red Light Supplementing Light Emitting Device As a white light emitting light source, a white LED light emitting device 1 (hereinafter this may be referred to as "white LED 1") including a light emitting element having an emission peak wavelength in a range of 380 nm or more and 490 nm or less, and a yellow fluorescent material and a red fluorescent material was used. The light emitted by the white LED light emitting device 1 was measured using the above-mentioned spectrometer (PMA-12 manufactured by Hamamatsu Photonics). In the white LED light emitting device 1, when the photon flux B of blue light, as calculated through integration of the photon flux data in a range of 400 nm or more and 490 nm or less, is referred to as 1 (one), the photon flux G of green light, as calculated through integration of the photon flux data in a range of more than 490 nm and 570 nm or less, is 1.7.

Using the spectrometer, the spectrum of the white LED light emitting device 1 and the spectrum of the red light supplementing light emitting device of Examples 1 and 2 and Comparative Examples 1 to 5 were measured. From the spectrum of the white LED light emitting device 1, and the spectrum of the red light supplementing light emitting device of each Example and each Comparative Example, the photon flux $B_{mix}$ of blue light in a range of 400 nm or more and 490 nm or less of the mixed light of the light emitted by the white LED light emitting device 1 and the light emitted by the red light supplementing light emitting device of each Example and each Comparative Example, and the photon flux $R_{mix}$ of red light in a range of 620 nm or more and 700 nm or less thereof were calculated. The white LED light emitting device 1 and the red light supplementing light emitting device of each Example and each Comparative Example were combined in such a manner that the ratio of the photon flux $R_{mix}$ of red light of the mixed light to the photon flux $B_{mix}$ of blue light of the mixed light, $R_{mix}/B_{mix}$, could be 3.5. Hereinunder the photon flux of blue light in a range of 400 nm or more and 490 nm or less of the mixed light of a combination of the white light emitted by the white light emitting light source and the light emitted by the red light supplementing light emitting device, as calculated from the spectrum of the light from the white light emitting light source and the spectrum of the light emitted by the red light supplementing light emitting device, is referred to as $B_{mix}$, and the photon flux of the red light in a range of 620 nm or more and 700 nm or less of the mixed light is represented by $R_{mix}$.

Combination of White LED Light Emitting Device 2 and Red Light Supplementing Light Emitting Device As a white light emitting light source, a white LED light emitting device 2 (hereinafter this may be referred to as "white LED 2") including a light emitting element having an emission peak wavelength in a range of 380 nm or more and 490 nm or less, and a green fluorescent material, a yellow fluorescent material and a red fluorescent material was used. The light emitted by the white LED light emitting device 2 was measured using the above-mentioned spectrometer. In the white LED light emitting device 2, when the photon flux B of blue light, as calculated through integration of the photon flux data in a range of 400 nm or more and 490 nm or less, is referred to as 1 (one), the photon flux G of green light, as calculated through integration of the photon flux data in a range of more than 490 nm and 570 nm or less, is 1.7.

Using the spectrometer, the spectrum of the white LED light emitting device 2 and the spectrum of the red light supplementing light emitting device of Examples 1 and 2 and Comparative Examples 1 to 5 were measured. From the spectrum of the white LED light emitting device 2, and the spectrum of the red light supplementing light emitting device of each Example and each Comparative Example, the photon flux $B_{mix}$ of blue light in a range of 400 nm or more and 490 nm or less of the mixed light of the light emitted by the white LED light emitting device 2 and the light emitted by the red light supplementing light emitting device of each Example and each Comparative Example, and the photon flux $R_{mix}$ of red light in a range of 620 nm or more and 700 nm or less thereof were calculated. The white LED light emitting device 2 and the red light supplementing light emitting device of each Example and each Comparative Example were combined in such a manner that the ratio of the photon flux $R_{mix}$ of red light of the mixed light to the photon flux $B_{mix}$ of blue light of the mixed light, $R_{mix}/B_{mix}$, could be 3.5.

Photon Flux

Figure 4:
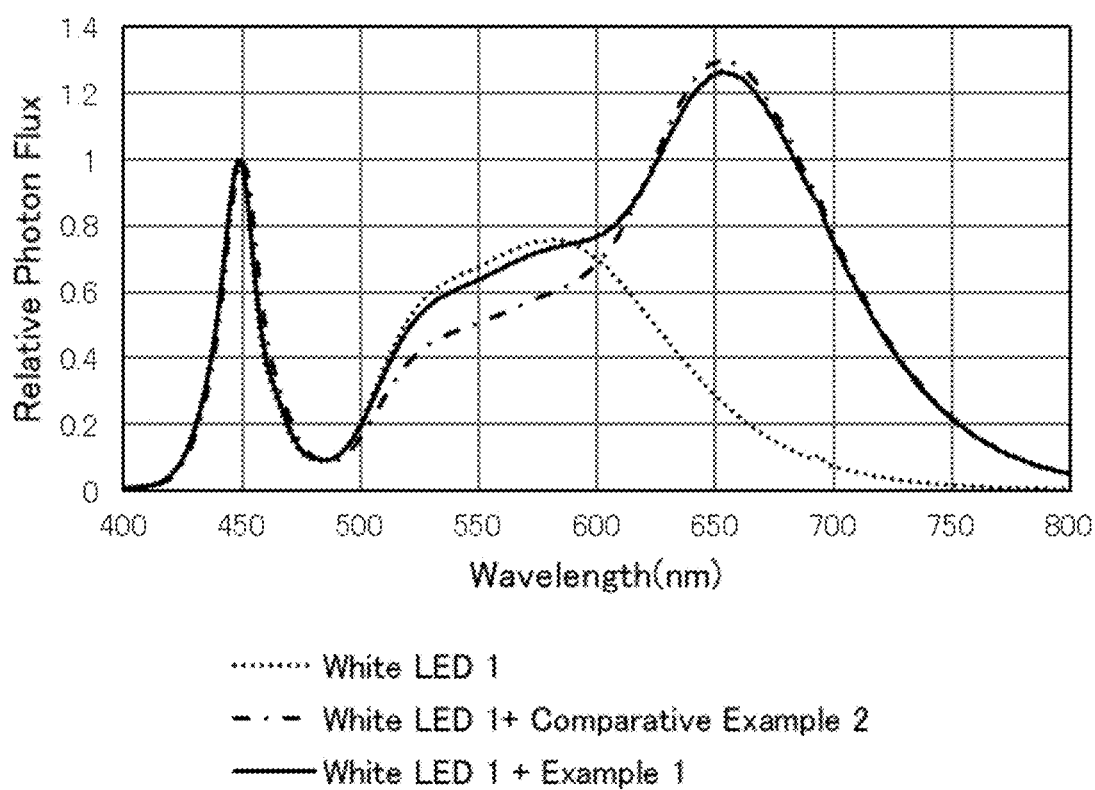
FIG. 4 shows a relative photon flux spectrum of a light emitted by the white LED light emitting device 1 alone, a relative photon flux spectrum of a mixed light of a combination of the white LED light emitting device 1 and a light emitting device for red light supplement of Example 1, and a relative photon flux spectrum of a mixed light of a combination of the white LED light emitting device 1 and a light emitting device for red light supplement of Comparative Example 2.
Figure 5:
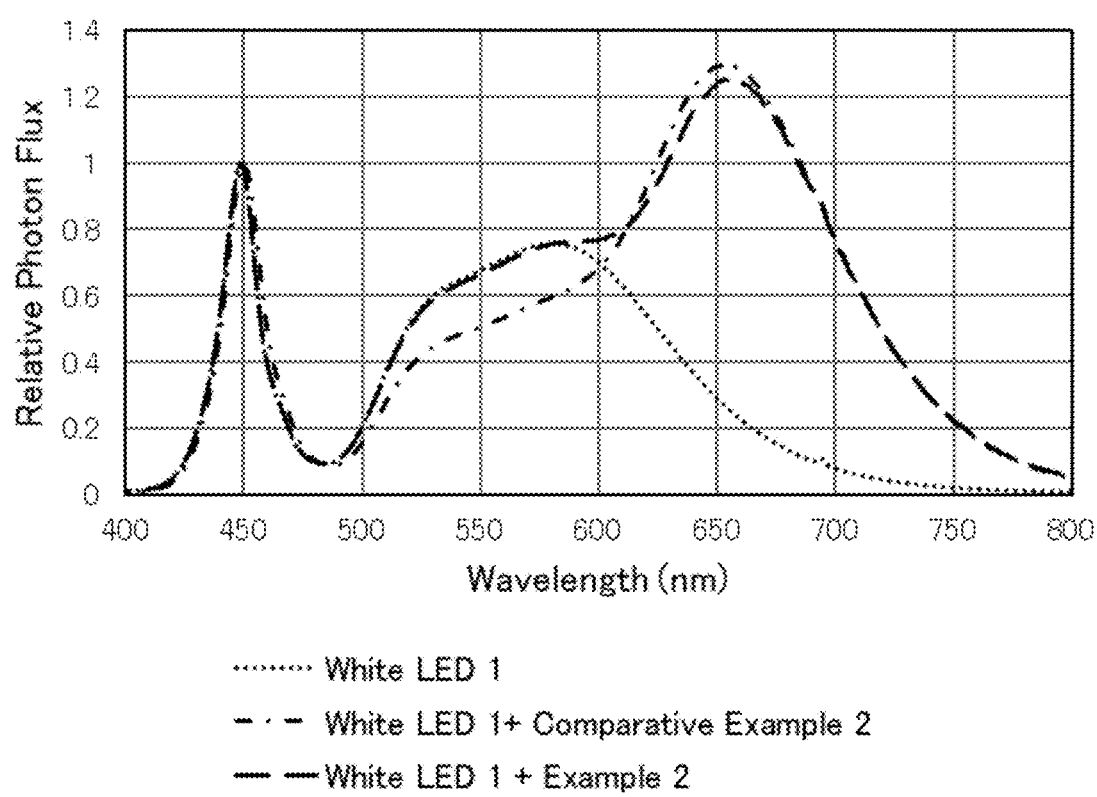
FIG. 5 shows a relative photon flux spectrum of a light emitted by the white LED light emitting device 1 alone, a relative photon flux spectrum of a mixed light of a combination of the white LED light emitting device 1 and a light emitting device for red light supplement of Example 2, and a relative photon flux spectrum of a mixed light of a combination of the white LED light emitting device 1 and the light emitting device for red light supplement of Comparative Example 2.

Using the above-mentioned spectrometer (PMA-12 manufactured by Hamamatsu Photonics), the light emitted by the white LED light emitting device 1 or 2 and the light emitted by the red light supplementing light emitting device of each Example and each Comparative Example were measured. The resultant spectral data or radiation flux data were combined to give a spectrum or a radiation flux of the mixed light from a combination of the white LED light emitting device 1 or 2 and the red light supplementing light emitting device of each Example and each Comparative Example. These were converted into the respective photon flux based on the above-mentioned equation (1) and a spectrum of the photon flux was drawn, and the photon flux data in a range of 400 nm or more and 700 nm or less were integrated to calculate the photosynthetic photon flux PPF. The results are shown in Table 2, Table 3 and FIG. 3. FIG. 4 shows, based on the photon flux at the emission peak wavelength 450 nm as referred to as 1, a relative photon flux spectrum of the light emitted by the white LED light emitting device 1 alone, a relative photon flux spectrum of a mixed light of a combination of the light from the white LED light emitting device 1 and the light from the red light supplementing light emitting device of Example 1, and a relative photon flux spectrum of a mixed light of a combination of the light from the white LED light emitting device 1 and the light from the red light supplementing light emitting device of Comparative Example 2. FIG. 5 shows, based on the photon flux at the emission peak wavelength 450 nm as referred to as 1, a relative photon flux spectrum of the light emitted by the white LED light emitting device 1 alone, a relative photon flux spectrum of a mixed light of a combination of the light from the white LED light emitting device 1 and the light from the red light supplementing light emitting device of Example 2, and a relative photon flux spectrum of a mixed light of a combination of the light from the white LED light emitting device 1 and the light from the red light supplementing light emitting device of Comparative Example 2.

G/B Retention Rate

The photon flux B of blue light in a range of 400 nm or more and 490 nm or less of the light emitted from the white LED light emitting device 1 or 2 alone, and the photon flux G of green light in a range of more than 490 nm and 570 nm or less thereof were calculated in the same manner as that for the photon flux mentioned above. As so described hereinabove, when the photon flux B of blue light in a range of 400 nm or more and 490 nm or less of the light emitted from the white LED light emitting device 1 or 2 alone is referred to as 1, the photon flux G of green light in a range of more than 490 nm and 570 nm or less is 1.7 (ratio G/B=1.7/1).

In addition, the photon flux B of blue light in a range of 400 nm or more and 490 nm or less of the mixed light of the light from the white LED light emitting device 1 and the light from the red light supplementing light emitting device of each Example and each Example, as so combined that the ratio of the photon flux $R_{mix}$ of the red light to the photon flux $B_{mix}$ of the blue light, $R_{mix}/B_{mix}$, could be 3.5, and the photon flux G of green light in a range of more than 490 nm and 570 nm or less thereof were calculated in the same manner as that for the photon flux above. The ratio G/B of the light emitted from the white LED light emitting device 1 or 2 alone was referred to as 100%, and the ratio of the numerical value of the ratio G/B of the mixed light in the combination of the white LED light emitting device 1 or 2 and the red light supplementing light emitting device of each Example and each Comparative Example, to the numerical value of the ratio of G/B of the light emitted from the white LED light emitting device 1 or 2 alone was expressed as a G/B retention rate (%). The numerical value of the G/B retention rate nearer to 100 means that, even in the case where red light is supplemented from a red light supplementing light emitting device, the spectral balance of the light from the white LED light emitting device alone is still kept as such with no reduction in the components of green light.

Ratio by Number (%) of White LED Light Emitting Device

The total number of the light emitting devices in a combination of the white LED light emitting device 1 or 2, and the red light supplementing light emitting device of each Example and each Comparative Example, as combined in such a manner that the ratio of the photon flux $R_{mix}$ of red light to the photon flux $B_{mix}$ of blue light, $R_{mix}/B_{mix}$, could be 3.5, is referred to as 100%, and the ratio by number of the white LED light emitting device relative to the total number of the white LED light emitting device 1 or 2 and the red light supplementing light emitting device of each Example and each Comparative Example was expressed as a ratio by number (%) of the white LED light emitting device. The results are shown in Tables 2 and 3 and in FIG. 3. For example, in the case where the white LED light emitting device and the light emitting device of Comparative Example 1 were so combined that the ratio $R_{mix}/B_{mix}$ could be 3.5, the ratio by number of the white LED light emitting device is less than 10%, and the ratio by number of the light emitting device of Comparative Example 1 is 90% or more. In this case where the white LED light emitting device 1 or 2 and the red light supplementing light emitting device of Comparative Example 1 are combined in order that the combined light emitting devices could supply a mixed light whose ratio $R_{mix}/B_{mix}$ could be 3.5, 9 red light supplementing light emitting devices of Comparative Example 1 are needed relative to 1 (one) white LED light emitting device 1 or 2.

TABLE 2

| | White LED Light Emitting Device 1 and Red Light Supplementing Light Emitting Device | | | |
| --- | --- | --- | --- | --- |
| | Ratio R/B of Red Light Supplementing Light Emitting Device | Photosynthetic Photon Flux PPF ($\mu mol \cdot s^{-1}$) | Ratio by number of White LED Light Emitting Device 1 (%) | G/B Retention Rate (%) |
| Comparative Example 1 | 4 | 32.2 | 5.7 | 9.9 |
| Comparative Example 2 | 10 | 34.0 | 41.8 | 72.3 |
| Example 1 | 36 | 33.0 | 48.7 | 92.9 |
| Example 2 | 101 | 32.8 | 50.4 | 97.6 |
| Comparative Example 3 | 273 | 31.9 | 49.7 | 99.2 |
| Comparative Example 4 | 571 | 31.1 | 48.8 | 99.7 |
| Comparative Example 5 | 1247 | 27.4 | 43.4 | 99.9 |

TABLE 3

| | White LED Light Emitting Device 2 and Red Light Supplementing Light Emitting Device | | | |
|---|---|---|---|---|
| | Ratio R/B of Red Light Supplementing Light Emitting Device | Photosynthetic Photon Flux PPF ($\mu mol \cdot s^{-1}$) | Ratio by number of White LED Light Emitting Device 2 (%) | G/B Retention Rate (%) |
| Comparative Example 1 | 4 | 32.2 | 8.0 | 11.5 |
| Comparative Example 2 | 10 | 34.0 | 50.8 | 76.4 |
| Example 1 | 36 | 33.2 | 57.6 | 94.2 |
| Example 2 | 101 | 33.0 | 59.2 | 98.1 |
| Comparative Example 3 | 273 | 32.3 | 58.7 | 99.4 |
| Comparative Example 4 | 571 | 31.6 | 57.6 | 99.7 |
| Comparative Example 5 | 1247 | 28.4 | 52.4 | 99.9 |

Figure 3:
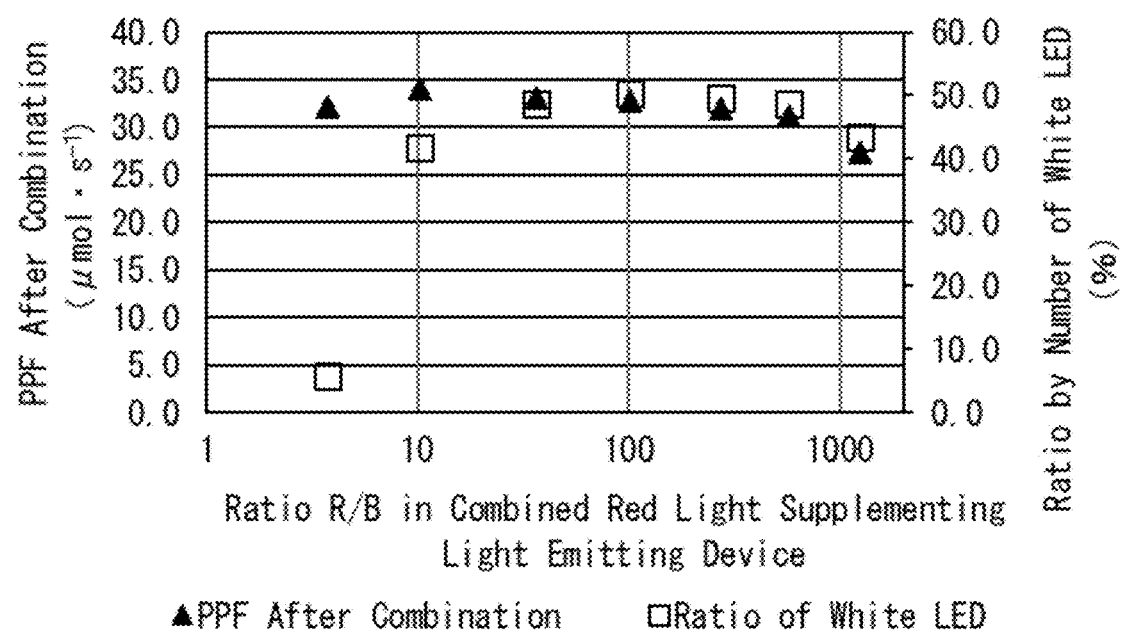
FIG. 3 is a graph showing a relationship between the photosynthetic photon flux PPF of a mixed light of a combination of a white LED light emitting device 1 and a light emitting device for red light supplement of each of Examples and Comparative Examples, and the number ratio (%) of the white LED light emitting device 1 in the combination of the white LED light emitting device and the light emitting device for red light supplement of each of Examples and Comparative Examples, and the ratio R/B in combined red light supplementing light emitting device.

As shown in Table 2 and FIG. 3, in the case where the red light supplementing light emitting device of Example 1 in which the ratio R/B was 36 or Example 2 in which the ratio R/B was 101 was combined with the white LED light emitting device 1, the ratio by number of the white LED light emitting device 1 in the resultant combination was near to 50%. The results indicate that, in combining the white LED light emitting device 1 and the red light supplementing light emitting device of Example 1 or 2 in order that the ratio of the photon flux $R_{mix}$ of red light to the photon flux $B_{mix}$ of blue light, $R_{mix}/B_{mix}$, could be 3.5, the ratio by number of the white LED light emitting device 1 to the red light supplementing light emitting device of Example 1 or 2 is about 1/1 (50%/50%). These results have demonstrated that, in these combinations, a small number of red light supplementing light emitting devices, relative to the necessary number of already existing white light emitting light sources, can efficiently supplement red light. In addition, it has been found that the red light supplementing light emitting device of Example 1 and 2 can efficiently supplement red light while preventing reduction in the photosynthetic photon flux PPF and in accordance with the type of plants or the growth stage of plants. In particular, in the combination with the red light supplementing light emitting device of Example 2, the ratio of the number of white LED light emitting devices 1 was larger than that in the combination with the red light supplementing light emitting device of Example 1, and from this, it has been found that the light emitting device of Example 2 can more efficiently supplement red light while preventing reduction in the photosynthetic photon flux PPF.

As shown in Table 3, in combining the white LED light emitting device 2 with the red light supplementing light emitting device of Example 1 or 2, the ratio by number of the white LED light emitting devices 2 was near to 60%. The results indicate that, in combining the white LED light emitting device 2 and the red light supplementing light emitting device of Example 1 or 2 in order that the ratio of the photon flux $R_{mix}$ of red light to the photon flux $B_{mix}$ of blue light, the ratio $R_{mix}/B_{mix}$ could be 3.5, the ratio by number of the white LED light emitting device 2 to the red light supplementing light emitting device of Example 1 or 2 is about 6/4 (60%/40%). These results have demonstrated that, in these combinations, a smaller number of red light supplementing light emitting devices, relative to the necessary number of already existing white light emitting light sources, can more efficiently supplement red light. In the combination with the red light supplementing light emitting device of Example 2, the ratio of the number of white LED light emitting devices 2 was larger than that in the combination with the red light supplementing light emitting device of Example 1, and the G/B retention rate was also high. Therefore, it has been found that the light emitting device of Example 2 can more efficiently supplement red light while preventing reduction in the photosynthetic photon flux PPF.

As shown in Tables 2 and 3, in the combination of the red light supplementing light emitting device of Example 1 or 2 with the white LED light emitting device 1 or 2, the G/B retention rate is more than 90% and is high. This has demonstrated that the combined devices can efficiently supplement red light while maintaining the spectral balance of the light emitted by the white LED light emitting device 1 or 2 without reducing the components of green light to yellow light in the spectrum of the light emitted from the white LED light emitting device 1 or 2. In particular, both in the combination with the white LED light emitting device 1 and in the combination with the white LED light emitting device 2, the red light supplementing light emitting device of Example 2 had a G/B retention rate larger than that of the red light supplementing light emitting device of Example 1, and more efficiently supplemented red light.

As shown in FIG. 4, a part in a range of more than 490 nm and 570 nm or less of the spectrum of the photon flux of the mixed light in the combination of the white LED light emitting device 1 and the red light supplementing light emitting device of Example 1 has a shape similar to that of the spectrum in a range of more than 490 nm and 570 nm or less of the white LED light emitting device 1 alone, and it has been demonstrated that the combined devices can efficiently supplement red light in a range of 620 nm or more and 700 nm or less while maintaining the spectral balance of the light emitted by the white LED light emitting device 1.

As shown in FIG. 5, a part in a range of more than 490 nm and 570 nm or less of the spectrum of the photon flux of the mixed light in the combination of the white LED light emitting device 1 and the red light supplementing light emitting device of Example 2 has a shape more similar to that of the spectrum in a range of more than 490 nm and 570 nm or less of the white LED light emitting device 1 alone, and precisely, the spectrum of that part of the combined devices almost overlaps with the spectrum in a range of more than 490 nm and 570 nm or less of the white LED light emitting device 1 alone. From the spectrum of the photon flux of the mixed light from the combination of the white LED and the red light supplementing light emitting device of Example 2, as shown in FIG. 5, it has been demonstrated that, when combined with the white LED light emitting device 1, the red light supplementing light emitting device of Example 2 can more efficiently maintain the spectral balance of the light from the white LED light emitting device 1 than the red light supplementing light emitting device of Example 1, and can more efficiently supplement red light in a range of 620 nm or more and 700 nm or more than the latter.

As shown in Table 2, FIG. 4 and FIG. 5, a part in a range of more than 490 nm and 570 nm or less of the spectrum of the photon flux of the mixed light in the combination of the white LED light emitting device 1 and the light emitting device of Comparative Example 2 is lower than the spectrum in a range of more than 490 nm and 570 nm or less of the white LED light emitting device 1 alone. In the light emitting device of Comparative Example 2, the ratio of the photon flux R of red light to the photon flux B of blue light, the ratio R/B is 10 and is small, and therefore, the excited light from the light emitting device could not be subjected to wavelength conversion in the red fluorescent material and the blue light emitted from the light emitting element fell out of the light emitting device, and as a result, the components of green light to yellow light relatively decreased owing to addition of the blue light components, the spectral balance of the light emitted from the already existing light source was thereby lost and red light supplement could not be attained efficiently.

As shown in Tables 2 and 3, when the light emitting device of Comparative Example 1 where the ratio R/B is 4 is combined with the white LED light emitting device 1 or 2, the ratio by number of the white LED light emitting device 1 or 2 in the resultant combination is less than 10%. The results indicate that, in combining the white LED light emitting device 1 or 2 and the red light supplementing light emitting device of Comparative Example 1 in order that the ratio of the photon flux $R_{mix}$ of red light to the photon flux $B_{mix}$ of blue light, the ratio $R_{mix}/B_{mix}$ could be 3.5, 9 light emitting devices of Comparative Example 1 are needed relative to 1 (one) white LED light emitting device 1. Namely, in the case, the ratio by number of the white LED light emitting device to the red light supplementing light emitting device of Comparative Example 1 is about 1/9 (10%/90%). From this, it has been found that, in these combinations, a large number of red light supplementing light emitting devices of Comparative Example 1 are needed relative to the necessary number of the white LED light emitting device 1 or 2 for red light supplement. In the case where the light emitting device of Comparative Example 1 in which the ratio R/B is 4 is combined with the white LED light emitting device 1 or 2, the G/B retention ratio is 9.9 or 11.5 and is low, and the blue light emitted from the light emitting element in the light emitting device of Comparative Example 1 falls out of the device and, as a result, the components of green light to yellow light relatively reduce owing to addition of the blue light components, the spectral balance of the light emitted by the white LED light emitting device 1 or 2 is lost, and efficient red light supplement alone could not be attained. In the case where the light emitting device of Comparative Example 2 in which the ratio R/B is 10 is combined with the white LED light emitting device 1 or 2, the G/B retention rate is 72.3 or 76.4 and is low, and blue light emitted from the light emitting element in the light emitting device of Comparative Example 2 falls out of the device and, as a result, the components of green light to yellow light relatively reduce owing to addition of the blue light components, the spectral balance of the light emitted by the white LED light emitting device 1 or 2 is lost, and efficient red light supplement alone could not be attained.

As shown in Table 2 and FIG. 3, in the case where the light emitting device of Comparative Examples 3 to 5 in which the ratio R/B is more than 200 is combined with the white LED light emitting device 1 or 2, the synthetic photon flux PPF in a range of 400 nm or more and 700 nm or less is smaller than the photosynthetic photon flux PPF in the case where the white LED light emitting device 1 or 2 is combined with the red light supplementing light emitting device of Example 1 or 2, that is, in the former case, efficient red light supplement could not be realized.

When combined with an already existing, for example, white light emitting light source depending on the type of plants and on the growth stage thereof, the light emitting device according to an embodiment of the description can efficiently supplement red light without losing the spectral balance of the light emitted by the already existing light source, and can therefore be used as a light emitting device or an illumination device for plant cultivation to promote plant growth and to enhance functional plant nutrient components. According to the plant cultivation method of irradiating plants with the light emitted by the light emitting device according to an embodiment of the description, red light that could not be supplemented by the light to be emitted by an already existing, for example, white light emitting light source can be efficiently supplemented for plant cultivation, and therefore the method can be used in plant factories.

The invention claimed is:
1. A light emitting device comprising:
a light emitting element having an emission peak wavelength in a range of 380 nm or more and 490 nm or less; and
a red fluorescent material which is excited by the light from the light emitting element to emit light having at least one light emission peak wavelength in a range of 580 nm or more and 680 nm or less, wherein
a ratio of a photon flux R of red light in a range of 620 nm or more and 700 nm or less to a photon flux B of blue light in a range of 400 nm or more and 490 nm or less, R/B, is in a range of more than 20 and 200 or less.
2. The light emitting device according to claim 1, wherein the ratio R/B is in a range of 50 or more and 120 or less.
3. The light emitting device according to claim 1, wherein a light emission spectrum of the light emitting device has at least one light emission peak in a range of 580 nm or more and 680 nm or less and the full width at half maximum of the emission peak is 40 nm or more.
4. The light emitting device according to claim 1, wherein the red fluorescent material comprises an $Eu^{2+}$-activated silicon nitride comprising Al and at least one element selected from Sr and Ca.
5. The light emitting device according to claim 1, wherein the red fluorescent material comprises at least one selected from the group consisting of:
an $Eu^{2+}$-activated aluminum nitride comprising at least one element selected from the group consisting of an alkaline earth metal element and at least one element selected from the group consisting of an alkali metal element,
an $Mn^{4+}$-activated fluorogermanate fluorescent material,
an $Eu^{2+}$-activated, Ca or Sr sulfide, and an Mn$^{4+}$-activated fluoride comprising at least one element or ion selected from the group consisting of an alkali metal element and an ammonium ion (NH$_4$+) and at least one element selected from the group consisting of a Group-4 element and a Group-14 element in the composition thereof.

6. The light emitting device according to claim 1, wherein the red fluorescent material comprises a composition represented by the following formula (I):

$$(Ca_{1-s-t}Sr_sEu_t)_xAl_uSi_vN_w \qquad (I)$$

wherein s, t, u, v, w and x each satisfy 0≤s≤1, 0<t<1.0, 0<s+t<1.0, 0.8≤x≤1.0, 0.8≤u≤1.2, 0.8≤v≤1.2, 1.9≤u+v≤2.1, and 2.5≤w≤3.5.

7. The light emitting device according to claim 1, which is used in combination with a white light emitting light source.

8. The light emitting device according to claim 1, which is used for plant cultivation.

9. An illumination device comprising a combination of the light emitting device of claim 1, and a light source that emits a light energy different from that of the light emitting device of claim 1.

10. A plant cultivation method comprising irradiating plants with the light emitted by the light emitting device of claim 1.

* * * * *